United States Patent
Anders

(10) Patent No.: US 10,364,489 B2
(45) Date of Patent: Jul. 30, 2019

(54) APPARATUS AND METHODS FOR DEPOSITION OF MATERIALS ON INTERIOR SURFACES OF HOLLOW COMPONENTS

(71) Applicant: Andre Anders, El Cerrito, CA (US)

(72) Inventor: Andre Anders, El Cerrito, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/696,836

(22) Filed: Sep. 6, 2017

(65) Prior Publication Data

US 2018/0073128 A1 Mar. 15, 2018

Related U.S. Application Data

(60) Provisional application No. 62/395,135, filed on Sep. 15, 2016.

(51) Int. Cl.
| | | |
|---|---|---|
| C23C 14/30 | (2006.01) | |
| H05B 7/00 | (2006.01) | |
| C23C 14/28 | (2006.01) | |
| C23C 14/14 | (2006.01) | |
| C23C 14/04 | (2006.01) | |
| H05H 7/14 | (2006.01) | |

(52) U.S. Cl.
CPC ............ *C23C 14/28* (2013.01); *C23C 14/046* (2013.01); *C23C 14/14* (2013.01); *H05H 7/14* (2013.01)

(58) Field of Classification Search
CPC ....... C23C 14/28; C23C 14/30; C23C 14/046; C23C 14/048; C23C 14/14; C23C 14/083
USPC ........................................ 427/230, 237, 238
See application file for complete search history.

(56) References Cited

U.S. PATENT DOCUMENTS

| | | | |
|---|---|---|---|
| 4,785,806 A | | 11/1988 | Deckelbaum |
| 5,324,552 A | | 6/1994 | Opower |
| 5,372,862 A | * | 12/1994 | Krishnaswamy ..... C23C 14/046 118/716 |
| 5,490,912 A | * | 2/1996 | Warner ................... C23C 14/28 118/620 |
| 5,868,074 A | | 2/1999 | Neifert |
| 5,931,097 A | | 8/1999 | Neifert |
| 6,183,820 B1 | * | 2/2001 | Neff ....................... C23C 14/046 42/76.02 |
| 6,534,134 B1 | * | 3/2003 | Fernandez ............ C23C 14/046 148/519 |
| 6,946,031 B2 | | 9/2005 | Oshima |
| 7,099,533 B1 | * | 8/2006 | Chenard ............... G02B 6/4296 372/103 |
| 7,608,308 B2 | * | 10/2009 | Liu ........................ C23C 14/083 427/586 |
| 8,486,073 B2 | | 7/2013 | Ruutlu |

(Continued)

OTHER PUBLICATIONS

C. Benvenuti et al., "Influence of the elemental composition and crystal structure on the vacuum properties of Ti—Zr—V nonevaporable getter films," J. Vac. Sci. Technology A, vol. 19, pp. 2925-2930, 2001.

(Continued)

*Primary Examiner* — Michael P Wieczorek

(57) ABSTRACT

This disclosure provides systems, methods, and apparatus related to deposition techniques using laser ablation. In one aspect, an optical fiber and target of a material to be deposited on a first region of an interior surface of a hollow component are positioned in the hollow component. A first end of the optical fiber is coupled to a laser system. A second end of the optical fiber is proximate the target. The material is deposited on the first region of the interior surface of the hollow component by directing a first laser pulse from the laser system through the optical fiber to impinge on the target.

20 Claims, 5 Drawing Sheets

(56) References Cited

U.S. PATENT DOCUMENTS

| | | |
|---|---|---|
| 2004/0250769 A1 | 12/2004 | Freeman |
| 2010/0310788 A1 | 12/2010 | Dings |
| 2013/0180960 A1 | 7/2013 | Ki |
| 2016/0054216 A1 | 2/2016 | Sokol |

OTHER PUBLICATIONS

R. Valizadeh et al., "Comparison of Ti—Zr—V nonevaporable getter films deposited using alloy or twisted wire sputter-targets," J. Vac. Sci. Technology A, vol. 28, pp. 1404-1412, 2010.

N. M. Fried and K. E. Murray, "High-power thulium fiber laser ablation of urinary tissues at 1.94 µm," Journal of Endourology, vol. 19, pp. 25-31, Jan. 1, 2005 2005.

X. Peng et al., "High average power, high energy 1.55 µm ultrashort pulse laser beam delivery using large mode area hollow core photonic band-gap fiber," Optics Express, vol. 19, pp. 923-932, 2011.

M. Michieletto et al., "Hollow-core fibers for high power pulse delivery," Optics Express, vol. 24, pp. 7103-7119, 2016.

SAES Getters, "IntegraTorr Sputtered Non-Evaporable Getter," Italy, 2004.

B. Debord et al., "Multi-meter fiber-delivery and pulse self-compression of milli-Joule femtosecond laser and fiber-aided laser-micromachining," Optics Express vol. 22, Issue 9, pp. 10735-10746 (2014).

\* cited by examiner

APPARATUS AND METHODS FOR DEPOSITION OF MATERIALS ON INTERIOR SURFACES OF HOLLOW COMPONENTS

RELATED APPLICATIONS

This application claims priority to U.S. Provisional Patent Application Ser. No. 62/395,135, filed Sep. 15, 2016, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to deposition methods and apparatus and more particularly to deposition methods and apparatus for coatings on interior surfaces of hollow components.

BACKGROUND

Particle accelerators, including synchrotrons, make use of various coatings on interior surfaces of the accelerators. For example, three types of coatings generally used on the interior surfaces of a particle accelerator are: (1) superconducting coatings; (2) coatings that have low coefficient of secondary electron emission; and (3) getter coatings, specifically non-evaporative getter (NEG) coatings. A getter is a deposit of a material that is placed inside a vacuum system for the purpose of decreasing the pressure in the vacuum system and maintaining a vacuum. Getters can be used in a vacuum system to reduce the pressure to less than $7.5 \times 10^{-10}$ torr in the system.

Most of these coating can be deposited on surfaces by sputter deposition or sputtering, a physical vapor deposition (PVD) technique. In sputter deposition, particles are ejected from a solid target material due to bombardment of the target by energetic particles (e.g., gas ions). For example, a NEG coating can be generated by sputtering a compound wire or a twisted wire system (e.g., often titanium (Ti), vanadium (V), and/or zirconium (Zr)) to produce a metal alloy coating.

The technique of wire sputtering (i.e., sputtering a wire to deposit a material on interior surfaces of a tube or other structures) has issues, however, including: (1) a wire needs to be thin and under tension (e.g., to address thermal expansion) to coat the interior surfaces of small diameter tubes, and it tends to fracture; (2) the wire needs to be centered on-axis everywhere, which is difficult for very large length/diameter ratio tubes; and (3) the sputtering process gas needs to be static or near-static as pressure gradients produce different thicknesses (i.e., non-uniformities) in the deposited material.

Alternatively, atomic layer deposition, a layer-by-layer chemical vapor deposition (CVD) technique, or pulsed laser deposition (i.e., laser ablation), may be used to deposit some materials. Pulsed laser deposition (PLD) is a PVD technique in which a high-power pulsed laser beam is focused on a target of the material that is to be deposited. Material is vaporized from the target in a plasma plume and is deposited as a thin layer on a surface. Pulsed laser deposition shows great flexibility since practically all materials can be ablated when laser light of sufficient intensity is focused on a surface of a target. The needed high laser intensity (i.e., power density) can be achieved with pulsed lasers and depends on the laser pulse duration, laser wavelength, and the composition of the target material. The deposition of laser-ablated material using pulsed laser deposition is commonly performed on flat or structured substrates that are placed near the focal point of the laser. In some instances, substrates can be placed off-axis or in an eclipse configuration (i.e., with a shield between focal point and substrate) to modify the microstructure of the coating.

SUMMARY

One innovative aspect of the subject matter described in this disclosure can be implemented in a method including positioning an optical fiber and a target of a material to be deposited on a first region of an interior surface of a hollow component in the hollow component. A first end of the optical fiber is coupled to a laser system. A second end of the optical fiber is proximate the target. The material is deposited on the first region of the interior surface of the hollow component by directing a first laser pulse from the laser system through the optical fiber to impinge on the target.

Another innovative aspect of the subject matter described in this disclosure can be implemented in a method including positioning an optical fiber and a target of a material to be deposited on a first region of an interior surface of a hollow component in the hollow component. A first end of the optical fiber is coupled to a laser system. A second end of the optical fiber is proximate the target. The material is deposited on the first region of the interior surface of the hollow component by directing a first laser pulse from the laser system through the optical fiber to impinge on the target. A resistance between the hollow component and the target is measured. A position of the optical fiber, the target, or both the optical fiber and the target are changed to decrease the resistance between the hollow component and the target when the operation of depositing material on the first region of the interior surface of the hollow component is repeated.

Another innovative aspect of the subject matter described in this disclosure can be implemented in a method including positioning an optical fiber and target of a material to be deposited on a first region of an interior surface of a vacuum component in the vacuum component. The optical fiber comprises a hollow core optical fiber. The vacuum component has an inner diameter of about 6 millimeters or less. The material comprises a metal selected from a group consisting of niobium, zirconium, titanium, vanadium, hafnium, combinations thereof, and alloys thereof. A first end of the optical fiber is coupled to a laser system. A second end of the optical fiber and the target are positioned about 1 millimeter to 10 millimeters from each other. The material is deposited on the first region of the interior surface of the vacuum component by directing a laser pulse from the laser system through the optical fiber to impinge on the target.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Figure 1:
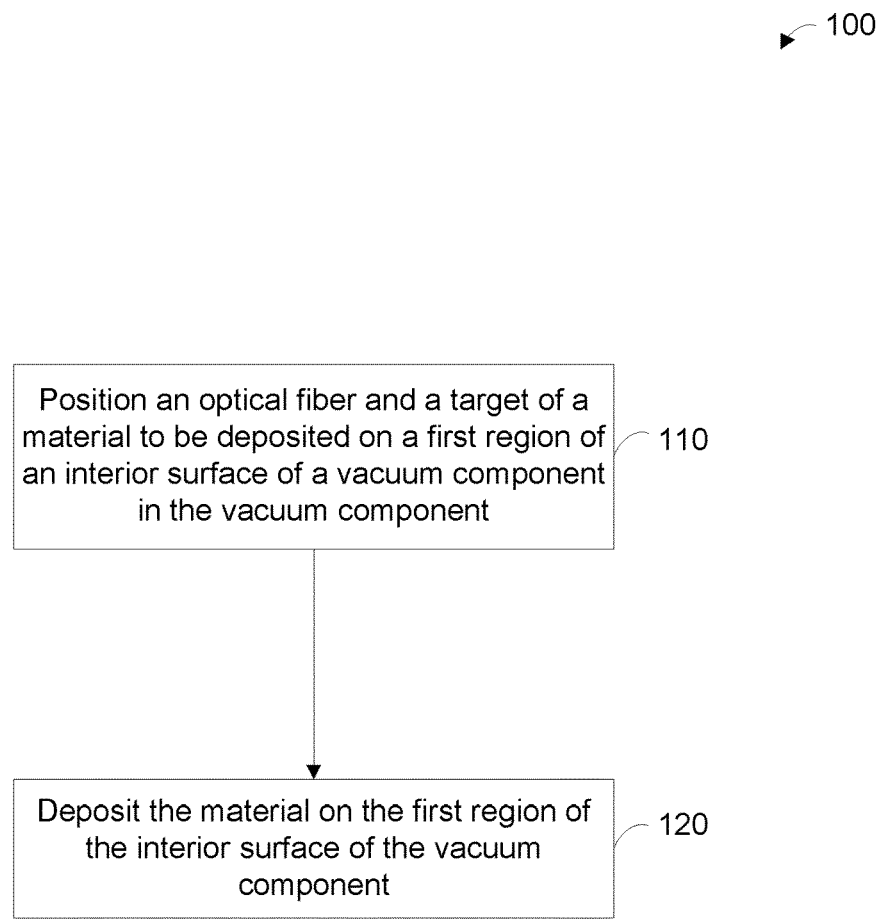
FIG. 1 shows an example of a flow diagram illustrating a process for depositing a material on an interior surface of a vacuum component.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a value is close to a targeted value, where close can mean, for example, the value is within 80% of the targeted value, within 90% of the targeted value, within 95% of the targeted value, or within 99% of the targeted value.

Apparatus and methods for depositing coatings on the interior surfaces of narrow and/or complicated structures are needed. For example, narrow and/or complicated structures and beam pipes having a large length/diameter ratio may be found in particle accelerators.

Laser light can be transported in optical fibers. At very high laser intensities, optical fibers may show non-linear light absorption, which can lead to the destruction of the optical fiber. Hollow core optical fibers have recently been developed in which the highest intensity of the laser light is near the center of the optical fiber. The center of such optical fibers can be evacuated (i.e., under vacuum) or filled with an inert or noble gas (e.g., helium). Such optical fibers are discussed in X. Peng et al., "High average power, high energy 1.55 µm ultra-short pulse laser beam delivery using large mode area hollow core photonic band-gap fiber," Optics Express, vol. 19, pp. 923-932, 2011 and M. Michieletto et al., "Hollow-core fibers for high power pulse delivery," Optics Express, vol. 24, pp. 7103-7119, 2016, both of which are herein incorporated by reference.

Such hollow core optical fibers open the possibility to perform a deposition process on interior surfaces of a hollow component using pulsed laser deposition to ablate a material to be deposited from a target. In some embodiments, deposition of a material is performed via ablation from a target using a suitable high power laser whose light output is coupled through an optical fiber and transported to impinge on the target to be ablated.

In the embodiments set forth below, the hollow component is a vacuum component and the material deposited on an interior surface of the vacuum component is a nonevaporative getter. The apparatus and methods described herein also may be used to deposit a coating of a material on interior surfaces of other hollow, narrow components. Such components may be used in environments other than vacuum environments, such a gas environments and liquid environments. For example, such hollow, narrow components include medical devices, medical implants, and biomedical implants.

FIG. 1 shows an example of a flow diagram illustrating a process for depositing a material on an interior surface a vacuum component. Starting at block 110 of the method 100 shown in FIG. 1, an optical fiber and a target of a material to be deposited on a first region of an interior surface of a vacuum component are positioned in the vacuum component. In some embodiments, the target comprises the material to be deposited. In some embodiments, the target consists of the material to be deposited. A first end of the optical fiber is coupled to a laser system. A second end of the optical fiber is proximate the target. In some embodiments, the second end of the optical fiber and the target are positioned about up to about 5 centimeters or less from each other, about 1 millimeter (mm) to 10 mm from each other, or about 1 mm to 3 mm from each other.

Figure 2:
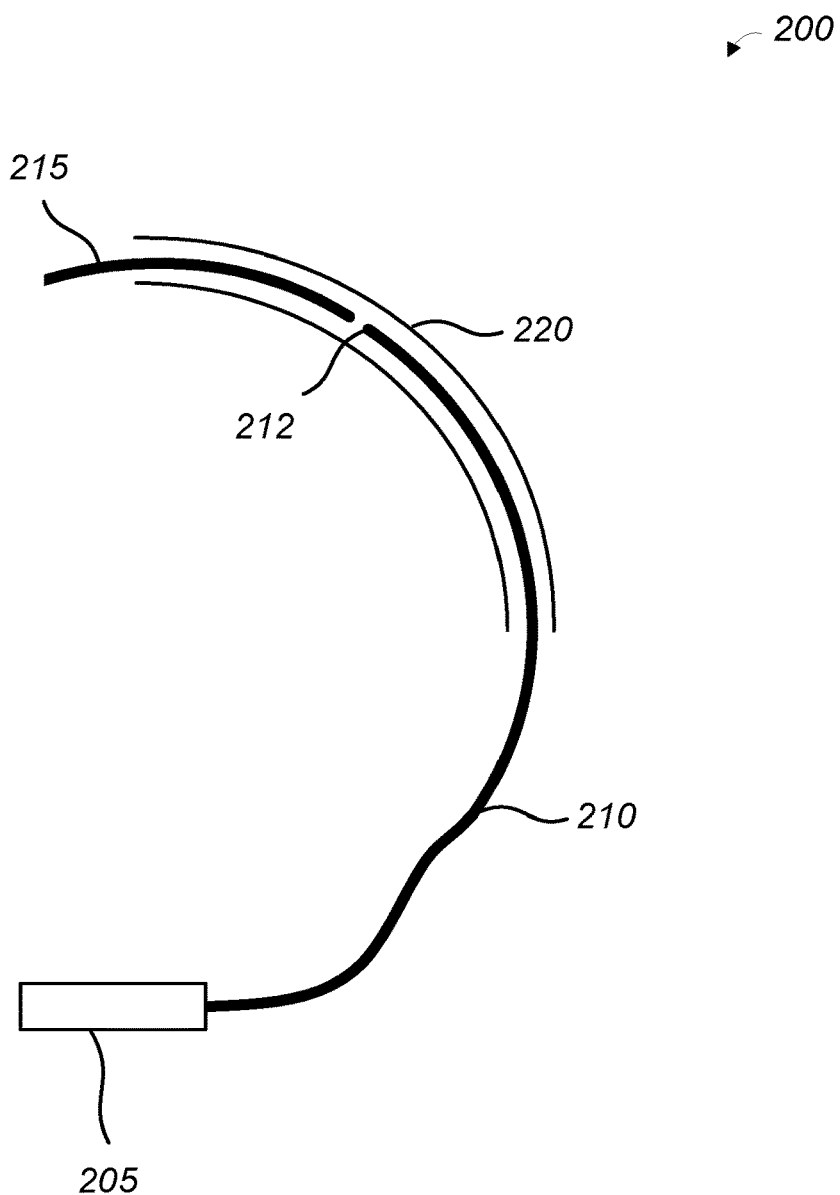
FIG. 2 shows an example of a schematic illustration of an apparatus for depositing a material on an interior surface of a vacuum component.

FIG. 2 shows an example of a schematic illustration of an apparatus for depositing a material on an interior surface of a vacuum component after block 110 in the method 100. The apparatus 200 includes a laser system 205 with a first end of an optical fiber 210 coupled to the laser system 205. A second end 212 of the optical fiber 210 is proximate a target 215 of a material to be deposited on a first region of an interior surface of a vacuum component 220.

In some embodiments, the laser system 205 comprises a pulsed laser system (i.e., a laser system including a pulsed laser). A pulsed laser is a laser that does not emit light in a continuous mode, but rather emits light in the form of optical pulses. In some embodiments, the laser system 205 comprises a Ti:sapphire laser. In some embodiments, the laser system comprises a 40 femtosecond Ti:sapphire laser with a regenerative amplifier, operating at a center wavelength of 805 nanometers, with a bandwidth of 35 nanometers, at a repetition rate of 1 kHz, focused on the target (e.g., at a distance of 5 centimeters), with a focal spot size in of about 40 microns.

In some embodiments, the optical fiber 210 comprises a photonic band gap hollow-core (PBG-HC) fiber or a hollow core bandgap fiber. In some embodiments, the optical fiber 210 comprises a hollow core bandgap fiber having a hollow core diameter of about 10 microns. In some embodiments, the optical fiber 210 comprises a hollow core bandgap fiber having a 35 nanometer wide single mode region close to the short wavelength edge of the bandgap.

In some embodiments, the material of the target 215 comprises a non-evaporative getter coating. For example, in some embodiments, the non-evaporative getter coating is selected from a group consisting of niobium, zirconium, titanium, vanadium, hafnium, combinations thereof, and alloys thereof. In some embodiments, the target 215 comprises a cylinder of the material having a diameter of about 3 millimeters or about 3 millimeters or less.

The vacuum component 220 may be any type of hollow component which is used as part of a vacuum system. In the example shown in FIG. 2, the vacuum component 220 comprises a tube. In some embodiments, an inner dimension or an inner diameter of the vacuum component 220 is about 6 mm or less or about 0.5 mm to 5 mm. In some embodiments, a length to inner dimension ratio or a length to inner diameter ratio of the vacuum component is at least about 5 to 1 or greater than about 5 to 1. In some embodiments, a length to inner dimension ratio or a length to inner diameter ratio of the vacuum component is greater than about 200 to 1. In some embodiments, the vacuum component 220 comprises a hollow component that is curved (e.g., a bent pipe or a bent tube) or a hollow component that is more complicated than a tube (e.g., cavities or beam and radiation entrance or exit systems associated with a particle accelerator).

Returning to FIG. 1, at block 120 the material is deposited on the first region of the interior surface of the vacuum component. The deposition of the material is accomplished by directing a first laser pulse from the laser system through the optical fiber to impinge on the target. In some embodiments, the first laser pulse is one of a plurality of laser pulses. When the first laser pulse is one of a plurality of laser pulses, the pulse repetition rate for the plurality of pulses may be about 1 kHz or higher. In some embodiments, a thickness of the material deposited on the first region of the interior surface of the hollow component is about 100 nm to 3 microns.

Laser light having a high power is generally considered to be when the power exceeds 1 megawatt (MW) and the power density in the focal point is greater than 100 MW/cm$^2$. Since the laser pulse duration can be in the range from about 50 femtoseconds (fs) to 50 nanoseconds (ns), it is common to consider the pulse duration and the laser energy delivered per pulse, rather than the laser power. In some embodiments, the first laser pulse has an energy of about 1 microjoule (µJ) or greater. In some embodiments, the first laser pulse has an energy of about 100 µJ or greater or at least about 100 µJ. In some embodiments, the first laser pulse has a wavelength of about 800 nm.

In some embodiments, when block 120 is performed, an inert or noble gas is flowing through the hollow core of the hollow core optical fiber. In some embodiments, the gas comprises argon. This may aid in the reducing or preventing deposition of the material on the end of the optical fiber from the counter streaming plasma flow from the target. The material being deposited on the end of the second of the optical fiber may cause problems with deposition of the material on the interior surface of the vacuum component when block 120 is repeated.

In some embodiments, block 120 is performed in a vacuum environment. For example, block 120 may be performed in a vacuum environment when depositing a getter coating. In some embodiments, the vacuum is a vacuum of about $1 \times 10^{-1}$ torr or lower, about $1 \times 10^{-2}$ torr or lower, or about $1 \times 10^{-3}$ torr or lower.

When depositing other materials (e.g., not a nonevaporative getter), in some embodiments, block 120 is performed in a gas atmosphere. For example, a low pressure oxygen atmosphere may be used when depositing an oxide coating. Other gas atmospheres may include nitrogen-containing gasses or nitrogen (e.g., for depositing nitrides), mixtures of oxygen and nitrogen-containing gasses or nitrogen (e.g., for depositing oxynitrides), and carbon-containing gases (e.g., for depositing carbides), such as hydrocarbons, for example. In such cases, the material of the target may comprise a metal.

As shown in FIG. 2, the target 215 of the material to be ablated and deposited on the interior of the vacuum component 220 can be moved with the optical fiber 210 so that the entire length of the interior surfaces of the vacuum component 220 can be coated with the material. For example, the motion of the target 215 and the optical fiber 210 can be continuous as the deposition process at block 120 of the method 100 is performed and repeated. Alternatively, the deposition process at block 120 can be performed. The target 215 and the optical fiber 210 can then be translated or repositioned in the vacuum component 220 and the deposition process at block 120 can be performed again.

Further, as shown in FIG. 2, both the optical fiber 210 and the target 215 can be bent. In some embodiments, both the optical fiber 210 and the target 215 can be bent to follow a circular arc, a curved path, or other path that is not a straight line. This may allow for the deposition of the material of the target 215 on the interior surfaces of vacuum components with complex geometries.

Figure 3:
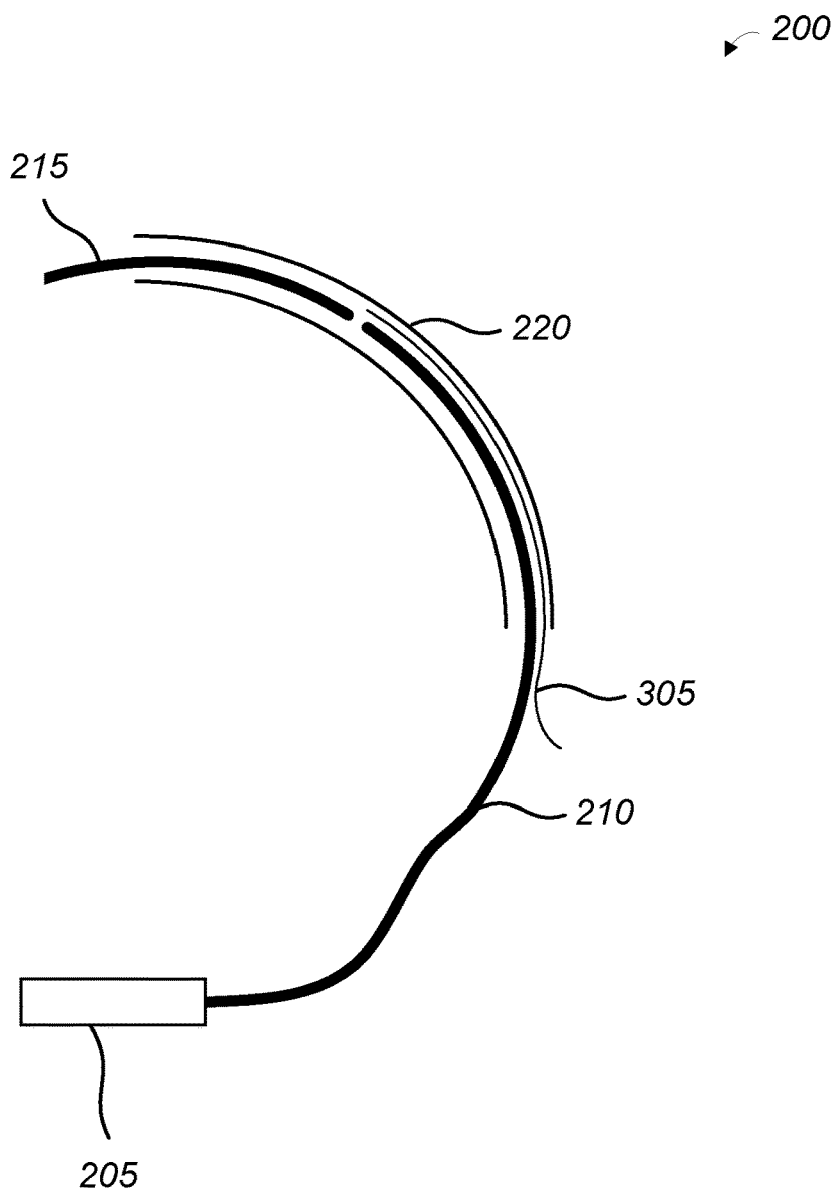
FIG. 3 shows an example of a schematic illustration of an apparatus for depositing a material on an interior surface of a vacuum component.

FIG. 3 shows an example of a schematic illustration of an apparatus for depositing a material on an interior surface of a vacuum component. The apparatus shown in FIG. 3 is the apparatus 200 shown in FIG. 2 with the addition of a second optical fiber 305. As shown in FIG. 3, in some embodiments, the second optical fiber 305 follows the same path in the vacuum component 220 as the optical fiber 210 that is used to guide the laser pulse. The second optical fiber may be used to monitor the deposition process and/or to inspect the deposited material.

In some embodiments, the apparatus described herein can be used for in-situ deposition of a coating. For example, a deposition apparatus could be installed as a component of an accelerator. The deposition apparatus could be used to repair or replace older coatings on the interior surfaces on the accelerator. For example, as accelerators age, NEG coatings lose pumping capacity; deposition of a new NEG coating may restore the pumping capacity.

In some embodiments, the apparatus and methods described herein can be used for in-situ activation of a coating. For example, some non-evaporative getter coatings need to be activated after deposition by heating them to about 100° C. to 550° C., or about 180° C. A second laser pulse or a series of laser pulses could be directed though the optical fiber to impinge on the material deposited with the method 100. In some embodiments, the second laser pulse or series of laser pulses is not focused. This would heat the surface of the deposited material.

Experiments on the focusing of laser light on a surface of a target (e.g., in the shape of a cylinder) positioned inside a tube have shown that an ablation plasma can be produced when the surface of the target is positioned at the focal spot of the focused laser. As material from the target is removed by ablation from the target, the surface of the target recedes and is no longer in the focal spot. Thus, plasma production is diminished and eventually ceases until the surface of the target is brought back to the focal spot of the laser.

In some embodiments, the methods described herein include adjusting the position of the focal spot of the laser and the position of the surface of the target. In some embodiments, adjusting the position of the focal spot of the laser and the position of the surface of the target is performed by moving the optical fiber or by moving the target. In some embodiments, adjusting the position of the focal spot of the laser and the position of the surface of the target is performed by moving both the optical fiber and the target. In some embodiments, moving the optical fiber and/or the target increases or maximizes the amount a material ablated from the target.

Many vacuum components comprise a metal and are non-transparent (i.e., one cannot view the interior of the vacuum component through a wall of the vacuum component). In some embodiments (e.g., when the vacuum component is non-transparent), the electrical resistance between the target and the vacuum component (i.e., the vacuum component to have its interior surface coated with material from the target) is measured. A plasma is an electrical conductor. A transient reduction in the electrical resistance occurs when an ablation plasma is present. This reduction in electrical resistance is only present when the ablation plasma is present. The duration of the presence of the plasma (and, the duration of the reduction of the electrical resistance) is a little longer than the laser pulse duration and typically in the microsecond range.

Based on the measured electrical resistance (e.g., before the ablation plasma, when the ablation plasma is present, and/or after the ablation plasma extinguishes), the positions of the target, the optical fiber, or both the target and the optical fiber can be adjusted to increase or maximize production of plasma from the ablation process. An increase or maximization of production of plasma from the ablation process would be indicated by a transient reduction or the greatest transient reduction of the resistance between the target and the vacuum component when the ablation plasma is present.

For example, the target (e.g., a NEG metal) can be electrically isolated from the vacuum component. When material from the target is not being ablated, the resistance between the target and the vacuum component is high (e.g., in the multi-mega-ohm range). When material from the target is being ablated, the conductivity of the plasma lowers the resistance between the target and the vacuum component when the plasma is present. When the amount of plasma produced increases, the resistance decreases further. Thus, by reducing and/or minimizing the resistance between the target and the vacuum component when the plasma is present by moving the target, the optical fiber, or both the target and optical fiber while ablating material from the target, the amount of plasma produced and the amount of material ablated can be increased or maximized.

Figure 4:
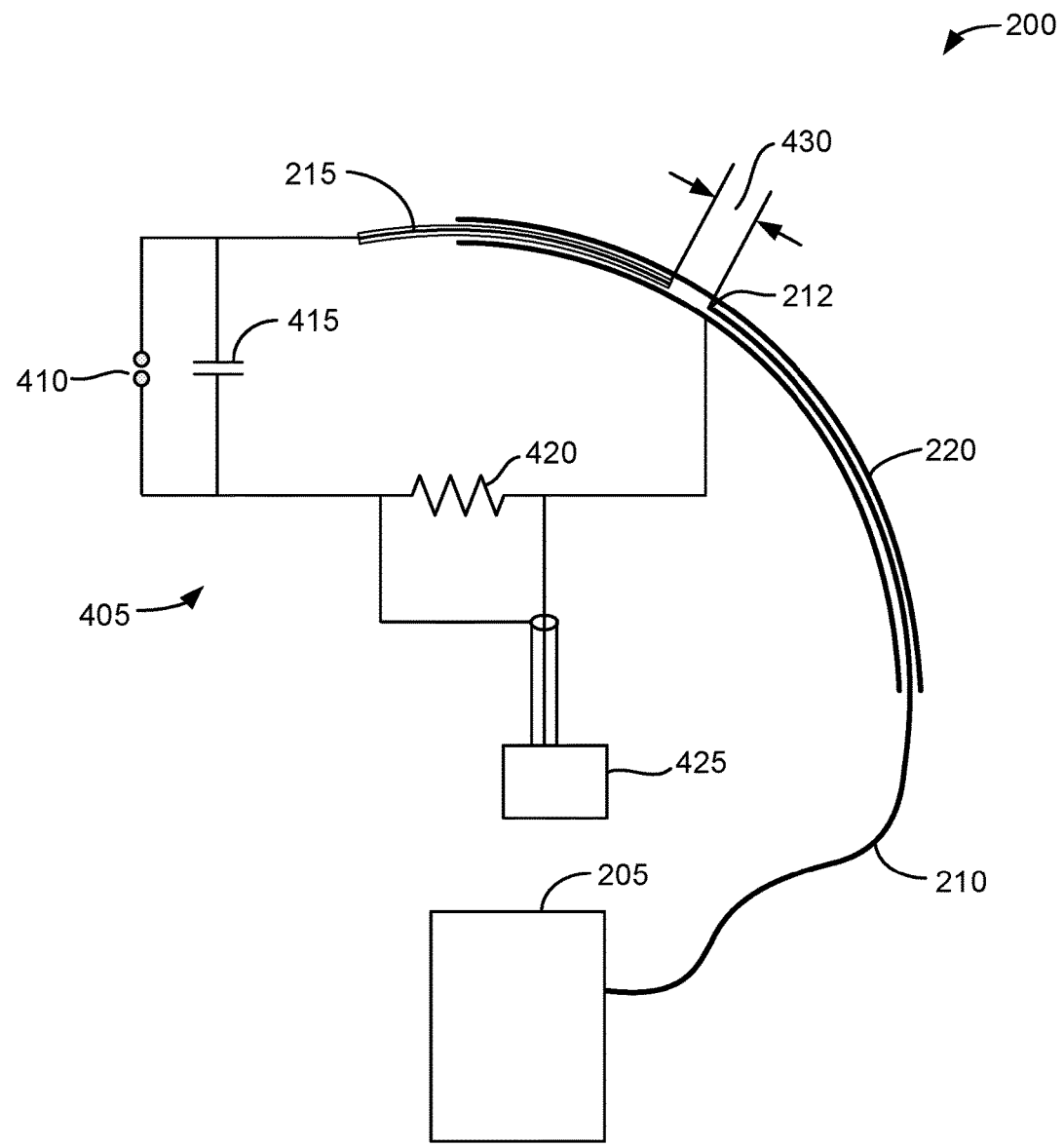
FIG. 4 shows an example of a schematic illustration of an apparatus for depositing a material on an interior surface of a vacuum component.

FIG. 4 shows an example of a schematic illustration of an apparatus for depositing a material on an interior surface of a vacuum component. The apparatus shown in FIG. 4 is the apparatus 200 shown in FIG. 2 with the addition of a circuit 405 to measure the resistance between the target and the vacuum component. The apparatus 200 includes the laser system 205 with a first end of the optical fiber 210 coupled to the laser system 205. The second end 212 of the optical fiber 210 is proximate the target 215 of a material to be deposited on a first region of an interior surface of the vacuum component 220. The circuit 405 includes a voltage source 410 (stabilized by a capacitor 415), a resistor 420, and an oscilloscope 425.

During operation of the apparatus 200, a voltage can be applied between the target 215 and the vacuum component 220. A current pulse that is generated when a plasma is generated can be measured by measuring the voltage drop over the resistor 420 using the oscilloscope 425. The magnitude of the resistance between the target 215 and the vacuum component 220 can be used to adjust a distance 430 between the second end 212 of the optical fiber 210 and the target 215 so that material is ablated from the target 215 to coat the interior surface of the vacuum component 220. This method is described further in the method 500 shown in FIG. 5.

Other circuits and/or circuit components could also be used to measure the resistance between the target and the vacuum component. For example, in some embodiments, the resistance can be measured using a different instrument. In some embodiments, the transient reduction of resistance can be measured as a peak in measured current, which may be detected using an inductive pickup coil (e.g., a Pearson coil), for example.

Further, applying a voltage to the vacuum component when depositing a material on an interior surface of the vacuum component may have additional benefits (e.g., other than for allowing for the measurement of the resistance between the target and the vacuum component). For example, biasing the vacuum component may affect the microstructure of the material deposition due to influencing the energy and impact angle of the ions arriving on the inner surface of the vacuum component.

Figure 5:
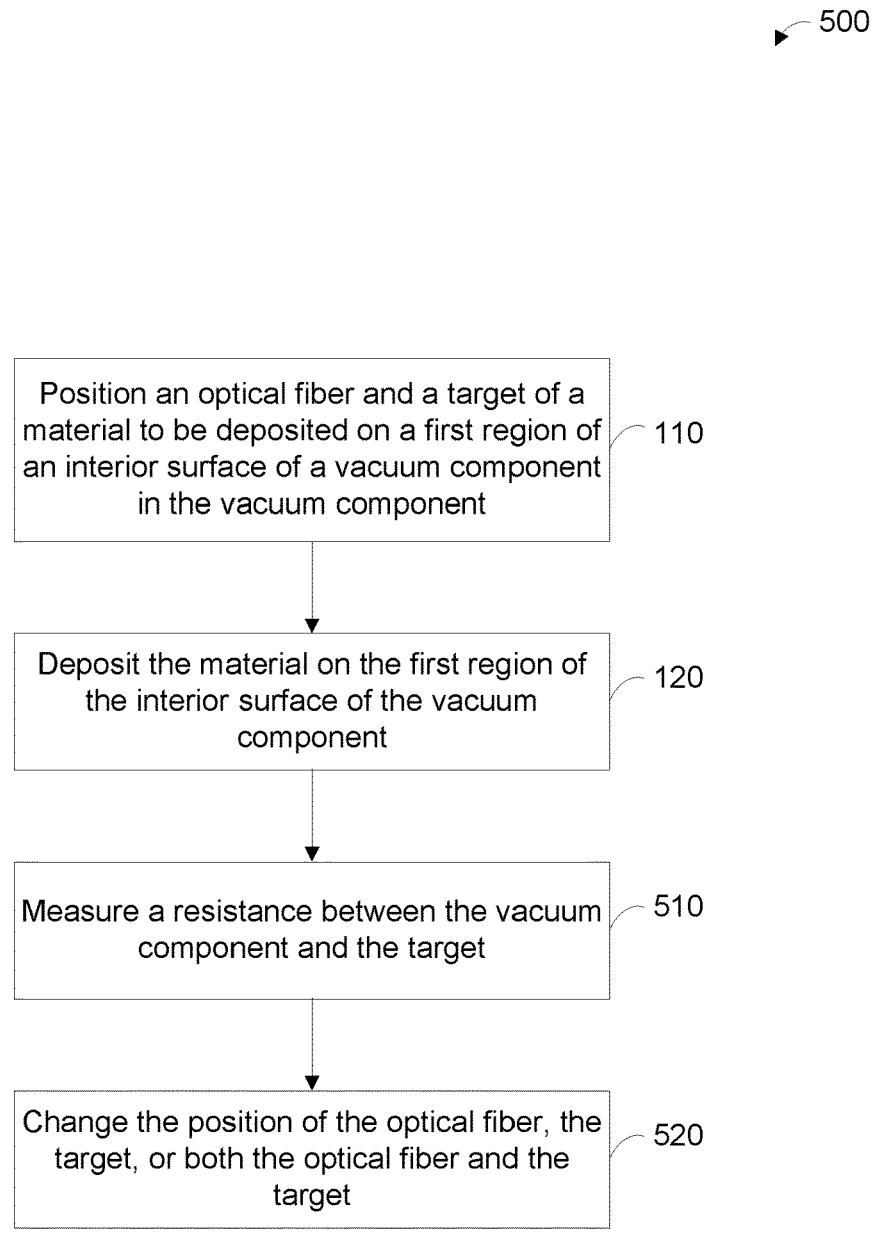
FIG. 5 shows an example of a flow diagram illustrating a process for depositing a material on an interior surface of a vacuum component.

FIG. 5 shows an example of a flow diagram illustrating a process for depositing a material on an interior surface of a vacuum component. Embodiments of the method 500 can be performed, for example, using an apparatus as shown in FIG. 4. In implementations of the method 500 shown in FIG. 5, both the material of the target of the vacuum component should be electrically conductive. For example, in some embodiments, the material of the target comprises or consists of a metal and the vacuum component comprises of consists of a metal.

In some embodiments, the target is sheathed, jacketed, or housed in an insulating material, with an end of the target to be ablated being exposed. For example, such a target may be similar to an insulated wire, with a long, thin cylinder of the target housed in a plastic or polymer. The target being coated with an insulating material may aid in preventing the conductive target from contacting the interior surface of the vacuum component.

Blocks 110 and 120 in the method 500 are the same as the blocks 110 and 120 in the method 100 shown in FIG. 1. Briefly, at block 110 an optical fiber and a target of a material to be deposited on a first region of an interior surface of a vacuum component are positioned in the vacuum component. At block 120 the material is deposited on the first region of the interior surface of the vacuum component.

At block 510, a resistance between the vacuum component and the target is measured. In some embodiments, a resistance between the vacuum component and the target is measured continuously. That is, the resistance between the vacuum component and the target can be measured before, during, and after block 120. For example, the resistance between the vacuum component and the target can be measured before, during, and after a time when an ablation plasma is present. When material is not being ablated from the target, the resistance is high. When material is being ablated from the target (e.g., over a time period of up to 2 microseconds or up to several microseconds), the conductivity of the plasma formed during the ablation process lowers the resistance between the target and the vacuum component.

At block 520, a position of the optical fiber, the target, or both are changed. The positions of the optical fiber, the target, or both are changed to decrease the resistance between the vacuum component and the target when block 120 is repeated. The resistance between the vacuum component and the target decreasing or being minimized when block 120 is repeated indicates that the optical fiber and the target are positioned so that the amount of material being ablated from the target is increasing or is at a maximum.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A method comprising:
    (a) positioning an optical fiber and a target of a material to be deposited on a first region of an interior surface of a hollow component in the hollow component, the hollow component being curved, a first end of the optical fiber coupled to a laser system, and a second end of the optical fiber proximate the target; and
    (b) depositing the material on the first region of the interior surface of the hollow component by directing a first laser pulse from the laser system through the optical fiber to impinge on the target.

2. The method of claim 1, further comprising:
    (c) after operation (b), translating the optical fiber and the target a distance in the hollow component; and
    (d) depositing the material on a second region of an interior surface of the hollow component by directing a second laser pulse from the laser system through the optical fiber to impinge on the target.

3. The method of claim 1, further comprising:
    after operation (b), adjusting a position of the second end of the optical fiber to increase an amount of the material deposited on the first region of the interior surface of the hollow component when operation (b) is repeated or adjusting a position of the target to increase an amount of the material deposited on the first region of the interior surface of the hollow component when operation (b) is repeated.

4. The method of claim 1, wherein the first laser pulse in one of a plurality of laser pulses.

5. The method of claim 1, wherein operation (b) is performed in a vacuum of about $1 \times 10^{-1}$ torr or lower.

6. The method of claim 1, wherein operation (b) is performed in an atmosphere containing a gas selected from a group consisting of oxygen, a nitrogen-containing gas, a carbon-containing gas, and mixtures thereof.

7. The method of claim 1, wherein the second end of the optical fiber and the target are positioned about 1 millimeter to 10 millimeters from each other.

8. The method of claim 1, wherein the first laser pulse has a pulse energy of at least about 100 microjoules and a wavelength of about 800 nm.

9. The method of claim 1, wherein the optical fiber comprises a hollow core bandgap fiber.

10. The method of claim 9, wherein an inert gas is flowing through a hollow core of the hollow core bandgap fiber during operation (b).

11. The method of claim 1, wherein the target comprises a cylinder of the material having a diameter of about 3 millimeters or less.

12. The method of claim 1, wherein the material comprises a metal selected from a group consisting of niobium, zirconium, titanium, vanadium, hafnium, combinations thereof, and alloys thereof.

13. The method of claim 1, wherein the hollow component comprises a tube with an inner diameter of about 6 millimeters or less.

14. The method of claim 1, wherein the material deposited on the first region of the interior surface of the hollow component has a thickness of about 100 nanometers to 3 microns.

15. A method comprising:
    (a) positioning an optical fiber and a target of a material to be deposited on a first region of an interior surface of a hollow component in the hollow component, a first end of the optical fiber coupled to a laser system, and a second end of the optical fiber proximate the target;
    (b) depositing the material on the first region of the interior surface of the hollow component by directing a first laser pulse from the laser system through the optical fiber to impinge on the target;
    (c) measuring a resistance between the hollow component and the target;
    (d) repeating operation (b); and
    (e) changing a position of the optical fiber, the target, or both the optical fiber and the target to decrease the resistance between the hollow component and the target when operation (b) is repeated.

16. The method of claim 15, wherein the second end of the optical fiber and the target are positioned about 1 millimeter to 10 millimeters from each other.

17. The method of claim 15, wherein the hollow component comprises a tube with an inner diameter of about 6 millimeters or less.

18. The method of claim 15, wherein the optical fiber comprises a hollow core bandgap fiber, and wherein an inert gas is flowing through a hollow core of the hollow core bandgap fiber during operation (b).

19. The method of claim 15, wherein the target comprises a cylinder of the material having a diameter of about 3 millimeters or less.

20. The method of claim 15, wherein the hollow component is curved.

* * * * *